United States Patent
Seefeldt et al.

(10) Patent No.: US 8,019,095 B2
(45) Date of Patent: Sep. 13, 2011

(54) LOUDNESS MODIFICATION OF MULTICHANNEL AUDIO SIGNALS

(75) Inventors: Alan Jeffrey Seefeldt, San Francisco, CA (US); Michael John Smithers, Kareela (AU)

(73) Assignee: Dolby Laboratories Licensing Corporation, San Francisco, CA (US)

( * ) Notice: Subject to any disclaimer, the term of this patent is extended or adjusted under 35 U.S.C. 154(b) by 198 days.

(21) Appl. No.: 12/225,988

(22) PCT Filed: Mar. 14, 2007

(86) PCT No.: PCT/US2007/006444
§ 371 (c)(1),
(2), (4) Date: Mar. 26, 2009

(87) PCT Pub. No.: WO2007/123608
PCT Pub. Date: Nov. 1, 2007

(65) Prior Publication Data
US 2010/0202632 A1    Aug. 12, 2010

Related U.S. Application Data

(60) Provisional application No. 60/789,523, filed on Apr. 4, 2006, provisional application No. 60/857,617, filed on Nov. 7, 2006.

(51) Int. Cl.
*H03G 3/00* (2006.01)

(52) U.S. Cl. ........ 381/107; 381/104; 381/105; 381/106; 700/94; 704/201; 704/225

(58) Field of Classification Search ............... 381/1–124, 381/300–311, 332–336; 700/94; 704/201, 704/225
See application file for complete search history.

(56) References Cited

U.S. PATENT DOCUMENTS

| 2,808,475 A | 10/1957 | Stryker |
| 4,281,218 A | 7/1981 | Chuang et al. |
| 4,543,537 A | 9/1985 | Kuhn et al. |
| 4,739,514 A | 4/1988 | Short et al. |
| 4,887,299 A | 12/1989 | Cummins et al. |

(Continued)

FOREIGN PATENT DOCUMENTS

DE    43 35 739    5/1995

(Continued)

OTHER PUBLICATIONS

Seefeldt, et al.; "A New Objective Measure of Perceived Loudness," Audio Engineering Society (AES) 117th Convention, Paper 6236, Oct. 28-31, 2004, San Francisco, CA, pp. 1-8.

(Continued)

*Primary Examiner* — Thanh V Pham
*Assistant Examiner* — Mark A Laurenzi

(57) ABSTRACT

Scaling, by a desired amount $s_m$, the overall perceived loudness $L_m$ of a multichannel audio signal, wherein perceived loudness is a nonlinear function of signal power P, by scaling the perceived loudness of each individual channel $L_c$ by an amount substantially equal to the desired amount of scaling of the overall perceived loudness of all channels $s_m$, subject to accuracy in calculations and the desired accuracy of the overall perceived loudness scaling $s_m$. The perceived loudness of each individual channel may be scaled by changing the gain of each individual channel, wherein gain is a scaling of a channel's power. Optionally, in addition, the loudness scaling applied to each channel may be modified so as to reduce the difference between the actual overall loudness scaling and the desired amount of overall loudness scaling.

11 Claims, 5 Drawing Sheets

(Combined Channels)

U.S. PATENT DOCUMENTS

| | | | |
|---|---|---|---|
| 5,027,410 | A | 6/1991 | Williamson et al. |
| 5,097,510 | A | 3/1992 | Graupe |
| 5,172,358 | A | 12/1992 | Kimura |
| 5,278,912 | A | 1/1994 | Waldhauer |
| 5,363,147 | A | 11/1994 | Joseph et al. |
| 5,369,711 | A | 11/1994 | Williamson, III |
| 5,377,277 | A | 12/1994 | Bisping |
| RE34,961 | E | 6/1995 | Widin et al. |
| 5,457,769 | A | 10/1995 | Valley |
| 5,500,902 | A | 3/1996 | Stockham, Jr. et al. |
| 5,530,760 | A | 6/1996 | Paisley |
| 5,548,638 | A | 8/1996 | Yamaguchi et al. |
| 5,583,962 | A | 12/1996 | Davis et al. |
| 5,615,270 | A | 3/1997 | Miller et al. |
| 5,632,005 | A | 5/1997 | Davis et al. |
| 5,633,981 | A | 5/1997 | Davis |
| 5,649,060 | A | 7/1997 | Ellozy et al. |
| 5,663,727 | A | 9/1997 | Vokac |
| 5,682,463 | A | 10/1997 | Allen |
| 5,712,954 | A | 1/1998 | Dezonno |
| 5,724,433 | A | 3/1998 | Engebretson et al. |
| 5,727,119 | A | 3/1998 | Davidson et al. |
| 5,819,247 | A | 10/1998 | Freund et al. |
| 5,848,171 | A | 12/1998 | Stockham, Jr. et al. |
| 5,862,228 | A | 1/1999 | Davis |
| 5,878,391 | A | 3/1999 | Aarts |
| 5,907,622 | A | 5/1999 | Dougherty |
| 5,909,664 | A | 6/1999 | Davis et al. |
| 6,002,776 | A | 12/1999 | Bhadkamkar et al. |
| 6,002,966 | A | 12/1999 | Loeb et al. |
| 6,021,386 | A | 2/2000 | Davis et al. |
| 6,041,295 | A | 3/2000 | Hinderks |
| 6,061,647 | A | 5/2000 | Barrett |
| 6,088,461 | A | 7/2000 | Lin et al. |
| 6,094,489 | A | 7/2000 | Ishige et al. |
| 6,108,431 | A | 8/2000 | Bachler |
| 6,125,343 | A | 9/2000 | Schuster |
| 6,148,085 | A | 11/2000 | Jung |
| 6,182,033 | B1 | 1/2001 | Accardi et al. |
| 6,185,309 | B1 | 2/2001 | Attias |
| 6,233,554 | B1 | 5/2001 | Heimbigner et al. |
| 6,240,388 | B1 | 5/2001 | Fukuchi |
| 6,263,371 | B1 | 7/2001 | Geagan, III et al. |
| 6,272,360 | B1 | 8/2001 | Yamaguchi et al. |
| 6,275,795 | B1 | 8/2001 | Tzirkel-Hancock et al. |
| 6,298,139 | B1 | 10/2001 | Poulsen et al. |
| 6,301,555 | B2 | 10/2001 | Hinderks |
| 6,311,155 | B1 | 10/2001 | Vaudrey et al. |
| 6,314,396 | B1 | 11/2001 | Monkowski |
| 6,327,366 | B1 | 12/2001 | Uvacek et al. |
| 6,332,119 | B1 | 12/2001 | Hinderks |
| 6,351,731 | B1 | 2/2002 | Anderson et al. |
| 6,351,733 | B1 | 2/2002 | Saunders et al. |
| 6,353,671 | B1 | 3/2002 | Kandel et al. |
| 6,370,255 | B1 | 4/2002 | Schaub et al. |
| 6,411,927 | B1 | 6/2002 | Morin et al. |
| 6,430,533 | B1 | 8/2002 | Kolluru et al. |
| 6,442,278 | B1 | 8/2002 | Vaudrey et al. |
| 6,442,281 | B2 | 8/2002 | Sato et al. |
| 6,473,731 | B2 | 10/2002 | Hinderks |
| 6,498,855 | B1 | 12/2002 | Kokkosoulis et al. |
| 6,529,605 | B1 | 3/2003 | Christoph |
| 6,570,991 | B1 | 5/2003 | Sheirer |
| 6,625,433 | B1 | 9/2003 | Poirier et al. |
| 6,639,989 | B1 | 10/2003 | Zacharov et al. |
| 6,650,755 | B2 | 11/2003 | Vaudrey et al. |
| 6,651,041 | B1 | 11/2003 | Juric |
| 6,700,982 | B1 | 3/2004 | Geurts et al. |
| 6,807,525 | B1 | 10/2004 | Li et al. |
| 6,823,303 | B1 | 11/2004 | Su et al. |
| 6,889,186 | B1 | 5/2005 | Michaelis |
| 6,985,594 | B1 | 1/2006 | Vaudrey et al. |
| 7,065,498 | B1 | 6/2006 | Thomas et al. |
| 7,068,723 | B2 | 6/2006 | Foote et al. |
| 7,155,385 | B2 | 12/2006 | Berestesky et al. |
| 7,171,272 | B2 | 1/2007 | Blarney et al. |
| 7,212,640 | B2 | 5/2007 | Bizjak |
| 7,454,331 | B2 | 11/2008 | Vinton |
| 2001/0027393 | A1 | 10/2001 | Touimi et al. |
| 2001/0038643 | A1 | 11/2001 | McParland |
| 2002/0013698 | A1 | 1/2002 | Vaudrey et al. |
| 2002/0040295 | A1 | 4/2002 | Saunders et al. |
| 2002/0076072 | A1 | 6/2002 | Cornelisse |
| 2002/0097882 | A1 | 7/2002 | Greenberg et al. |
| 2002/0146137 | A1 | 10/2002 | Kuhnel et al. |
| 2002/0147595 | A1 | 10/2002 | Baumgarte |
| 2003/0002683 | A1 | 1/2003 | Vaudrey et al. |
| 2003/0035549 | A1 | 2/2003 | Bizjak et al. |
| 2004/0024591 | A1 | 2/2004 | Boillot et al. |
| 2004/0037421 | A1 | 2/2004 | Truman |
| 2004/0042617 | A1 | 3/2004 | Beerends et al. |
| 2004/0044525 | A1 | 3/2004 | Vinton et al. |
| 2004/0076302 | A1 | 4/2004 | Christoph |
| 2004/0122662 | A1 | 6/2004 | Crockett |
| 2004/0148159 | A1 | 7/2004 | Crockett et al. |
| 2004/0165730 | A1 | 8/2004 | Crockett |
| 2004/0172240 | A1 | 9/2004 | Crockett et al. |
| 2004/0184537 | A1 | 9/2004 | Geiger et al. |
| 2004/0190740 | A1 | 9/2004 | Chalupper et al. |
| 2004/0213420 | A1 | 10/2004 | Gundry |
| 2006/0002572 | A1 | 1/2006 | Smithers et al. |
| 2006/0215852 | A1 | 9/2006 | Troxel |
| 2007/0291959 | A1 | 12/2007 | Seefeldt |

FOREIGN PATENT DOCUMENTS

| | | |
|---|---|---|
| DE | 198 48 491 | 4/2000 |
| EP | 0 517 233 | 12/1992 |
| EP | 0 637 011 | 2/1995 |
| EP | 0 661 905 | 5/1995 |
| EP | 0 746 116 | 12/1996 |
| EP | 1 239 269 | 9/2002 |
| EP | 1 251 715 | 10/2002 |
| EP | 1 387 487 | 4/2004 |
| EP | 1 736 966 | 7/2007 |
| FR | 2 820 573 | 8/2002 |
| WO | WO/98/27543 | 6/1998 |
| WO | WO/00/78093 | 12/2000 |
| WO | WO/02/17678 | 2/2002 |
| WO | WO 03/090208 | 10/2003 |
| WO | WO 2004/019656 | 3/2004 |
| WO | WO 2004/073178 | 8/2004 |
| WO | WO 2004/111994 | 12/2004 |
| WO | WO 2005/086139 | 9/2005 |
| WO | WO 2005/104360 | 11/2005 |
| WO | WO 2006/006977 | 1/2006 |
| WO | WO 2006/019719 | 2/2006 |
| WO | WO 2006/047600 | 5/2006 |
| WO | WO 2006/113047 | 10/2006 |
| WO | WO/2007/120452 | 10/2007 |
| WO | WO/2007/120453 | 10/2007 |
| WO | WO 2007/123608 | 11/2007 |
| WO | WO/2007/127023 | 11/2007 |
| WO | WO 2008/051347 | 5/2008 |
| WO | WO 2008/057173 | 5/2008 |
| WO | WO/2008/085330 | 7/2008 |
| WO | WO 2008/115445 | 9/2008 |
| WO | WO 2008/156774 | 12/2008 |

OTHER PUBLICATIONS

Chalupper, Josef; "Aural Exciter and Loudness Maximizer: What's Psychoacoustic about " Psychoacoustic Processors?, Audio Engineering Society (AES) 108th Convention, Sep. 22-25, 2000, Los Angeles, CA, pp. 1-20.

Claro Digital Perception Processing; "Sound Processing with a Human Perspective," pp. 1-8.

Masciale, John M.; "The Difficulties in Evaluating A-Weighted Sound Level Measurements," S&V Observer, pp. 2-3.

Ghent, Jr., et al.; "Expansion as a Sound Processing Tool in Hearing Aids," American Academy of Audiology National Convention, Apr. 29-May 2, 1999, Miami Beach, FL.

Ghent, Jr., et al.; "Uses of Expansion to Promote Listening Comfort with Hearing Aids," American Academy of Audiology 12th Annual Convention, Mar. 16-19, 2000, Chicago, IL.

Martinez G., Isaac; "Automatic Gain Control (AGC) Circuits—Theory and Design," University of Toronto ECE1352 Analog Integrated Circuits I, Term Paper, Fall 2001, pp. 1-25.

Park, et al.; "High Performance Digital Hearing Aid Processor with Psychoacoustic Loudness Correction," IEEE FAM P3.1 0-7803-3734-4/97, pp. 312-313.

Bray, et al.; "Optimized Target Matching: Demonstration of an Adaptive Nonlinear DSP System," Sonic Innovations vol. 1 No. 2 1998, pp. 1-4, presented at the American Academy of Audiology, Los Angeles, CA, Apr. 4, 1998.

Bray, et al.; "An "Optimized" Platform for DSP Hearing Aids," Sonic Innovations, vol. 1 No. 3 1998, pp. 1-4, presented at the Conference on Advanced Signal Processing Hearing Aids, Cleveland, OH, Aug. 1, 1998.

Bray, et al.; "Digital Signal Processing (DSP) Derived from a Nonlinear Auditory Model," Sonic Innovations, vol. 1 No. 1 1998, pp. 1-3, presented at American Academy of Audiology, Los Angeles, CA, Apr. 4, 1998.

Ghent, Jr., et al.; "Uses of Expansion to Promote Listening Comfort with Hearing Aids," Sonic Innovations, vol. 3 No. 2, 2000, pp. 1-4, presented at American Academy of Audiology 12th Annual Convention, Chicago, IL, Mar. 16-19, 2000.

Nilsson, et al.; "The Evolution of Multi-channel Compression Hearing Aids," Sonic Innovations, Presented at American Academy of Audiology 13th Convention, San Diego, CA, Apr. 19-22, 2001.

Johns, et al.; "An Advanced Graphic Equalizer Hearing Aid: Going Beyond Your Home Audio System," Sonic Innovations Corporation, Mar. 5, 2001, Http://www.audiologyonline.com/articles/pf_arc_disp.asp?id=279.

Smith, et al., "Tandem-Free VoIP Conferencing: A Bridge to Next-Generation Networks," IEEE Communications Magazine, IEEE Service Center, New York, NY, vol. 41, No. 5, May 2003, pp. 136-145.

H. H. Scott, "The Amplifier and its Place in the High Fidelity System," J. Audio Eng. Soc., vol. 1, No. 3, Jul. 1953.

Nigo, et al., "Concert-Hall Realism through the Use of Dynamic Level Control," J. Audio Eng. Soc., vol. 1, No. 1, Jan. 1953.

Newcomb, et al., "Practical Loudness: an Active Circuit Design Approach," J. Audio eng. Soc., vol. 24, No. 1, Jan./Feb. 1976.

Robinson, et a., Dynamic Range Control via Metadata, 107th Convention of the AES, Sep. 14-27, 1999, New York.

Watson, et al., "Signal Duration and Signal Frequency in Relation to Auditory Sensitivity," Journal of the Acoustical Society of America, vol. 46, No. 4 (Part 2) 1969, pp. 989-997.

ATSC Standard A52/A: Digital Audio Compression Standard (AC-3), Revision A, Advanced Television Systems Committee, Aug. 20, 2001. The A/52A document is available on the World Wide Web at http://www./atsc.org. standards.html.

Todd, et al., "Flexible Perceptual Coding for Audio Transmission and Storage," 96th Convention of the Audio Engineering Society, Feb. 26, 1994, Preprint, 3796.

Davis, Mark, "The AC-3 Multichannel Coder," Audio engineering Society, Preprint 3774, 95th AES Convention, Oct. 1993.

Bosi, et al., "High Quality, Low-Rate Audio Transform Coding for Transmission and Multimedia Applications," Audio Engineering Society Preprint 3365, 93rd AES Convention, Oct. 1992.

Fielder, et al., "Introduction to Dolby Digital Plus, an Enhancement to the Dolby Digital Coding System," AES Convention Paper 6196, 117th AES Convention, Oct. 28, 2004.

Truman, et al., "Efficient Bit Allocation, Quantization, and Coding in an Audio Distribution System," AES Preprint 5068, 107th AES Conference, Aug. 1999.

Fielder, et al., "Professional Audio Coder Optimized fro Use with Video," AES Preprint 5033, 107th AES Conference, Aug. 1999.

Brandenburg, et al., "Overview of MPEG Audio: Current and Future Standards for Low-Bit-Rate Audio Coding," J. Audio eng. Soc., vol. 45, No. 1/2, Jan./Feb. 1997.

Vernon, Steve, "Design and Implementation of AC-3 Coders," IEEE Trans. Consumer Electronics, vol. 41, No. 3, Aug. 1995.

Crockett, et al., "A Method for Characterizing and Identifying Audio Based on Auditory Scene Analysis," Audio Engineering Society Convention Paper 6416, 118th Convention, Barcelona, May 28-31, 2005.

Crockett, Brett, "High Quality Multichannel Time Scaling and Pitch-Shifting using Auditory Scene Analysis," Audio Engineering Society Convention Paper 5948, New York, Oct. 2003.

Hauenstein M., "A Computationally Efficient Algorithm for Calculating Loudness Patterns of Narrowband Speech," Acoustics, Speech and Signal Processing 1997. 1997 IEEE International Conference, Munich Germany, Apr. 21-24, 1997, Los Alamitos, Ca, USA, IEEE Comput. Soc., US, Apr. 21, 1997, pp. 1311-1314.

Cheng-Chieh Lee, "Diversity Control Among Multiple Coders: A Simple Approach to Multiple Descriptions," IEE, September.

Moore, et al., "A Model for the Prediction of Thresholds, Loudness and Partial Loudness," Journal of the Audio Engineering Society, Audio Engineering Society, New York, vol. 45, No. 4, Apr. 1997, pp. 224-240.

Glasberg, et al., "A Model of Loudness Applicable to Time-Varying Sounds," Journal of the Audio Engineering Society, Audio Engineering Society, New York, vol. 50, No. 5, May 2002, pp. 331-342.

Stevens, "Calculations of the Loudness of Complex Noise," Journal of the Acoustical Society of America, 1956.

Zwicker, "Psychological and Methodical Basis of Loudness," Acoustica, 1958.

Australian Broadcasting Authority (ABA), "Investigation into Loudness of Advertisements," Jul. 2002.

Zwicker, et al., "Psychoacoustics—Facts and Models," Springer-Verlag, Chapter 8, "Loudness," pp. 203-238, Berlin Heidelberg, 1990, 1999.

Lin, L., et al., "Auditory Filter Bank Design Using Masking Curves," 7th European Conference on Speech Communications and Technology, Sep. 2001.

ISO226 : 1987 (E), "Acoustics—Normal Equal Loudness Level Contours."

Seo, et al., "Auditory Model Design for Objective Audio Quality Measurement," Department of Electronic Engineering, Dongguk University, Seoul Korea.

Moulton, Dave, "Loud, Louder, Loudest!," Electronic Musician, Aug. 1, 2003.

Riedmiller, Jeff, "Working Toward Consistency in Program Loudness," Broadcast Engineering, Jan. 1, 2004.

Robinson, et al., "Time-Domain Auditory Model for the Assessment of High-Quality Coded Audio," 107th AES Convention, Sep. 1999.

Hermesand, et al., "Sound Design—Creating the Sound for Complex Systems and Virtual Objects," Chapter II, "Anatomy and Psychoacoustics," 2003-2004.

Notification of Transmittal of the International Search Report, PCT/US2006/011202, dated Aug. 9, 2006.

Written Opinion of the International Search Authority, PCT/US2006/011202, dated Aug. 9, 2006.

Carroll, Tim, "Audio Metadata: You can get there from here", Oct. 11, 2004, pp. 1-4, XP002392570. http://tvtechnology.com/features/audio_notes/f-TC-metadata-08.21.02.shtml.

Trapee, W., et al., "Key distribution for secure multimedia multicasts via data embedding," 2001 IEEE International Conferenced on Acoustics, Speech, and Signal Processing. May 7-11, 2001.

Bertsekas, Dimitri P., "Nonlinear Programming," 1995, Chapter 1.2 "Gradient Methods—Convergence," pp. 18-46.

Bertsekas, Dimitri P., "Nonlinear Programming," 1995, Chapter 1.8 "Nonderivative Methods,", pp. 142-148.

Moore, BCJ, "Use of a loudness model for hearing aid fitting, IV. Fitting hearing aids with multi-channel compression so as to restore "normal" loudness for speech at different levels." British Journal of Audiology, vol. 34, No. 3, pp. 165-177, Jun. 2000, Whurr Publishers, UK.

Saunders, "Real-Time Discrimination of Broadcast Speech/Music," Proc. of Int. Conf on Acoust. Speech and Sig. Proce., 1996, pp. 993-996.

Bosi, et al., "ISO/IEC MPEG-2 Advanced Audio coding," J. Audio Eng. Soc., vol. 45, No. 10, Oct. 1997, pp. 789-814.

Scheirer and Slaney, "Construction and Evaluation of a robust Multifeature Speech/Music Discriminator," Proc. of Int. Conf. on Acoust. Speech and Sig. Proc., 1997, pp. 1331-1334.

Schapire, "A Brief Introduction to Boosting," Proc. of the 16th Int. Joint Conference on Artificial Intelligence, 1999.

Guide to the Use of the ATSC Digital Television Standard, Dec. 4, 2003.
ISO Standard 532:1975, published 1975.
Belger, "The Loudness Balance of Audio Broadcast Programs," J. Audio Eng. Soc., vol. 17, No. 3, Jun. 1969, pp. 282-285.
Atkinson, I. A., et al., "Time Envelope LP Vocoder: A New Coding Technology at Very Low Bit Rates," $4^{th}$ ed., 1995, ISSN 1018-4074, pp. 241-244.
Mapes, Riordan, et al., "Towards a model of Loudness Recalibration." 1997 IEEE ASSP workshop on New Paltz, NY USA, Oct. 19-22, 1997.
CEI/IEC Standard 60804 published Oct. 2000.
Blesser, Barry, "An Ultraminiature console Compression System with Maximum User Flexibility," Journal of Audio Engineering Society, vol. 20, No. 4, May 1972 (1972-05), pp. 297-302.
Hoeg, W., et al., "Dynamic Range Control (DRC) and Music/Speech Control (MSC) Programme-Associated Data Services for DAB", EBU Review-Technical, European Broadcasting Union, Brussels, BE, No. 261, Sep. 21, 1994.
Soulodre, GA, "Evaluation of Objective Loudness Meters" Preprints of Papers Presented at the $116^{th}$ AES Convention, Berlin, Germany, May 8, 2004.
Notification of Transmittal of the International Search Report, PCT/US2007/08313), dated Sep. 21, 2007.
The Written Opinion of the International Searching Authority, PCT/US2007/08313), dated Sep. 21, 2007.
Notification of Transmittal of the International Search Report, PCT/US2007/007946, dated Aug. 21, 2007.
The Written Opinion of the International Searching Authority, PCT/US2007/007946, dated Aug. 21, 2007.
Notification of Transmittal of the International Search Report, PCT/US2007/007945, dated Aug. 17, 2007.
The Written Opinion of the International Searching Authority, PCT/US2007/007945, dated Aug. 17, 2007.
Notification of Transmittal of the International Search Report, PCT/US2007/0025747, dated Apr. 14, 2008.
The Written Opinion of the International Searching Authority, PCT/US2007/0025747, dated Apr. 14, 2008.
International Search Report, PCT/US2004/016964 dated Dec. 1, 2005.
Written Opinion of the International Searching Authority, PCT/US2004/016964 dated Dec. 1, 2005.
Written Opinion of the International Searching Authority, PCT/US2004/016964 dated Dec. 1, 2005.
International Search Report, PCT/US2006/010823 dated Jul. 25, 2006.
Written Opinion of the International Searching Authority, PCT/US2006/010823 dated Jul. 25, 2006.
International Search Report, PCT/US2005/038579 dated Feb. 21, 2006.
Written Opinion of the International Searching Authority, PCT/US2005/038579 dated Feb. 21, 2006.
International Search Report, PCT/US2007/022132 dated Apr. 18, 2008.
Written Opinion of the International Searching Authority, PCT/US2007/022132 dated Apr. 18, 2008.
International Search Report, PCT/US2007/006444 dated Aug. 28, 2007.
Written Opinion of the International Searching Authority, PCT/US2007/006444 dated Aug. 28, 2007.
Notification of Transmittal of the International Search Report, PCT/US2008/007570, dated Sep. 10, 2008.
The Written Opinion of the International Searching Authority, PCT/US2008/007570, dated Sep. 10, 2008.
International Search Report, PCT/US2007/020747, dated May 21, 2008.
Mexican Patent Application No. PA/a/2005/002290—Response to Office Action dated Oct. 5, 2007.
Communication Under Rule 51(4) EPC, European Patent Office, EP Application No. 03791682.2-2218, dated Dec. 5, 2005.
Notification of the First Office Action, Chinese Application No. 03819918.1, dated Mar. 30, 2007.
Response to Notification of the First Office Action, Chinese Application No. 03819918.1, dated Aug. 14, 2007.
Response Office Action from the Israel Patent Office, Israel Patent Application No. 165,398, dated Dec. 29, 2008.
Official Letter from the Intellectual Property Bureau, Ministry of Economic Affairs, Taiwan, dated Mar. 21, 2008.
Response to Official Letter from the Intellectual Property Bureau, Ministry of Economic Affairs, Taiwan, dated Jun. 25, 2008.
Written Opinion of the Intellectual Property Office of Singapore, Singapore Application No. 0702926-7, dated May 12, 2008.
European Patent Office, Office Action dated Apr. 2, 2008, EP Application No. 05818505.9.
European Patent Office, Response to Office Action dated Apr. 2, 2008, EP Application No. 05818505.9.
Australian Government IP Australia, Examiner's first report on patent application No. 2005299410, mailed Jun. 25, 2009, Australian Patent Appln. No. 2005299410.
Israel Patent Office, Examiner's Report on Israel Application No. 182097 mailed Apr. 11, 2010, Israel Patent Appln. No. 182097.
Intellectual Property Corporation of Malaysia, Substantive/Modified Substantive Examination Adverse Report (Section 30(1)/30(2)) and Search Report, dated Dec. 5, 2008, Malaysian Patent Appln. No. PI 20055232.
Dept of Justice & Human Rights of Republic of Indonesia, Directorate General Intellectual Property Rights, First Office Action received Apr. 22, 2010, Indonesian Patent Appln. No. WO0200701285.
State Intellectual Property Office of the People'S Republic of China, Notification of the Third Office Action, mailed Apr. 21, 2010, China Patent Appln. No. 200580036760.7.
European Patent Office Searching Authority, Int'l Search Report and Written Opinion, Int'l Appln. No. PCT/US2004/016964, mailed Jun. 20, 2005.

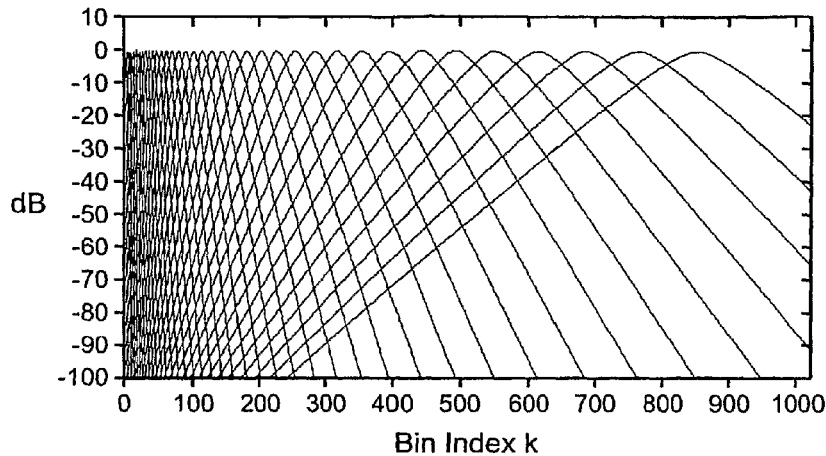
FIG. 3
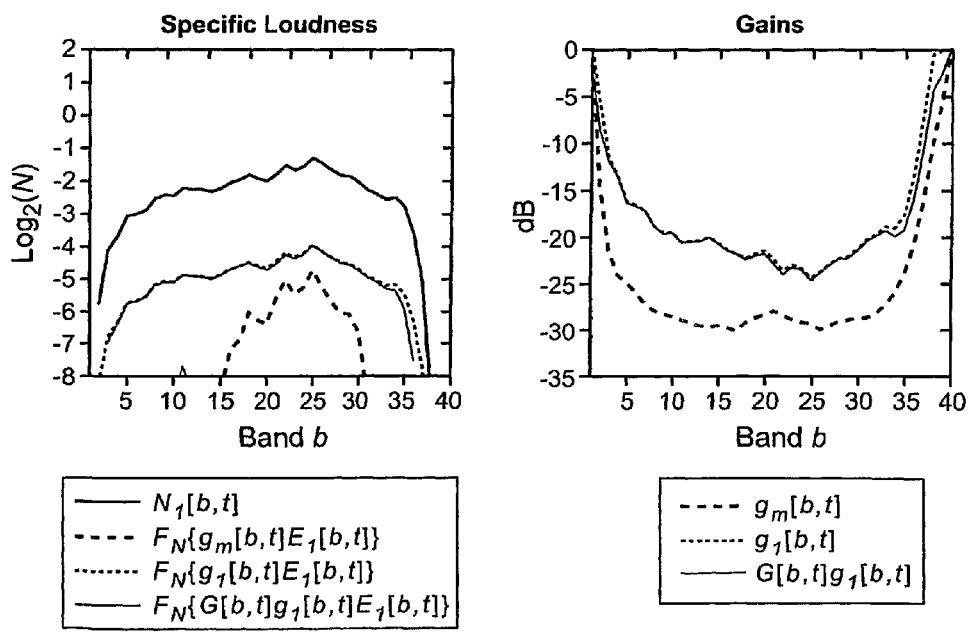
FIG. 4a *(Channel 1: Left)*

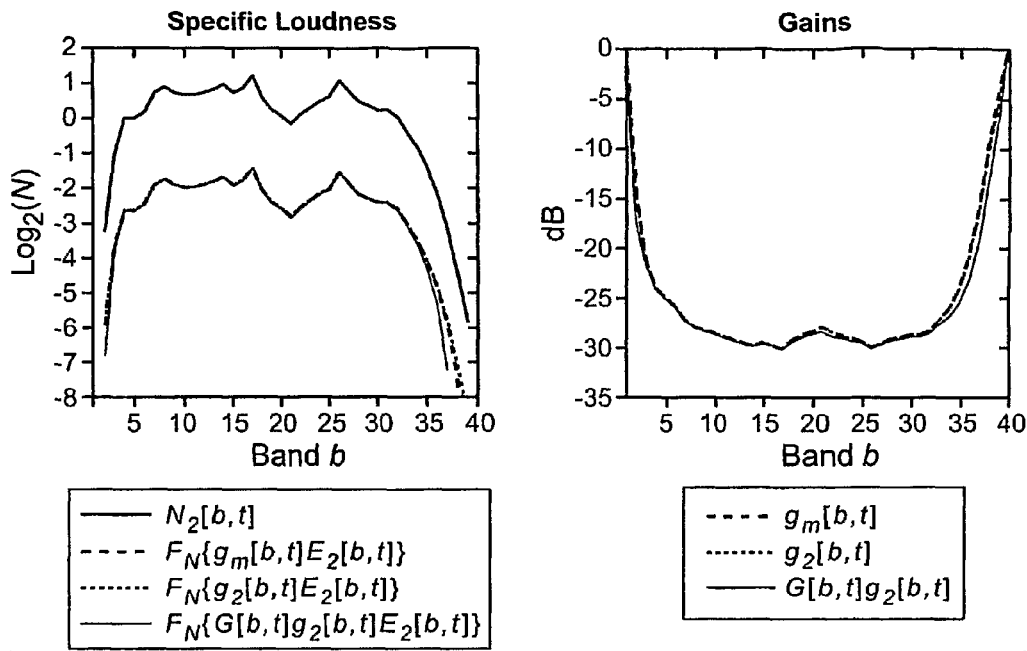
FIG. 4b *(Channel 2: Center)*
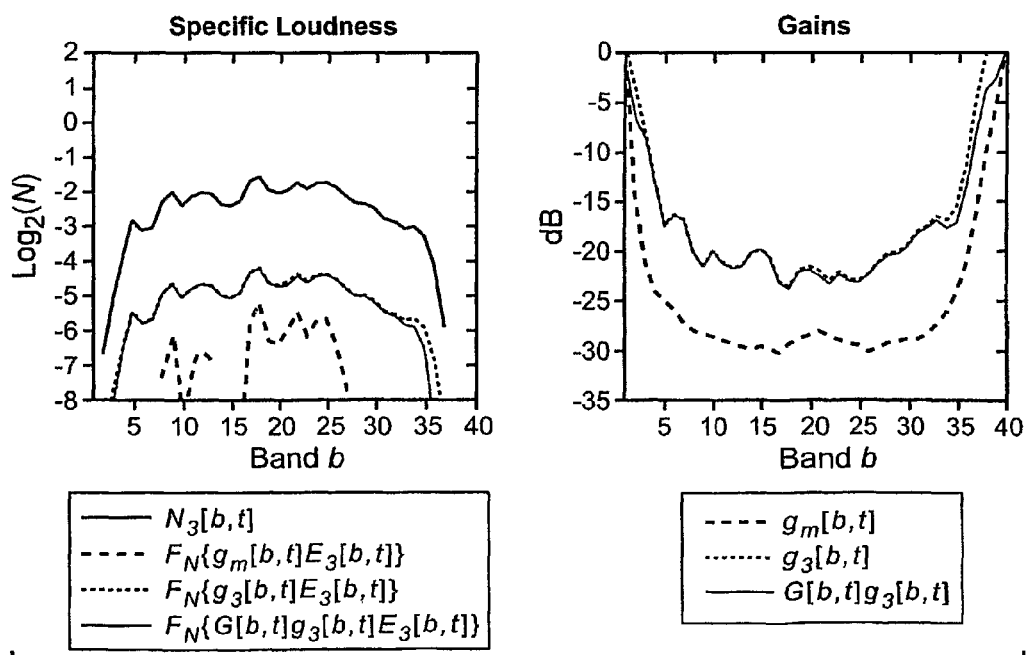
FIG. 4c *(Channel 3: Right)*

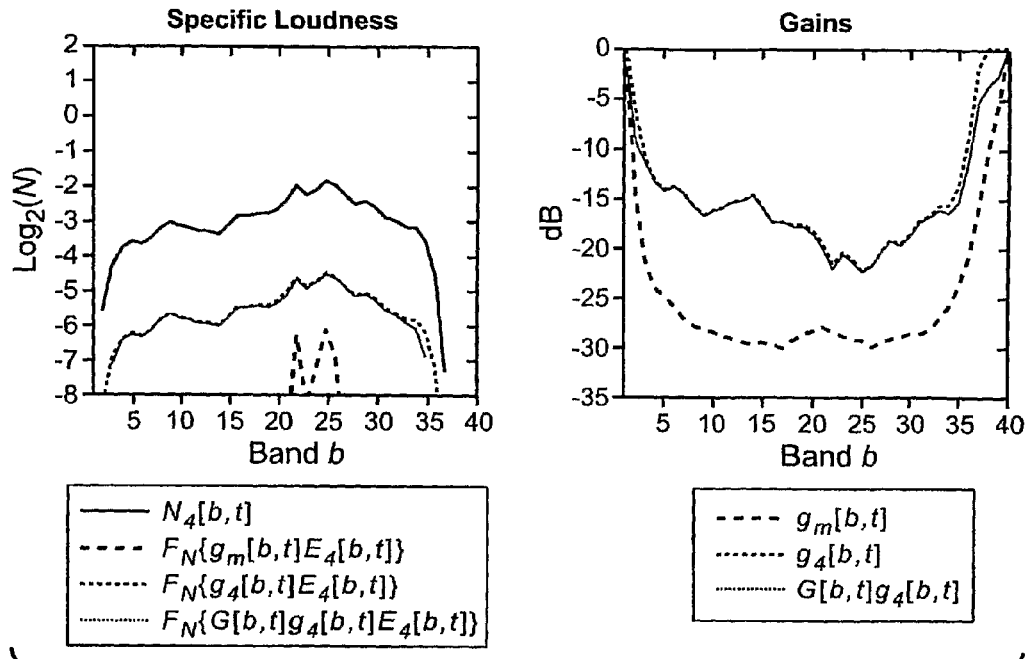
FIG. 4d (Channel 4: Left Surround)
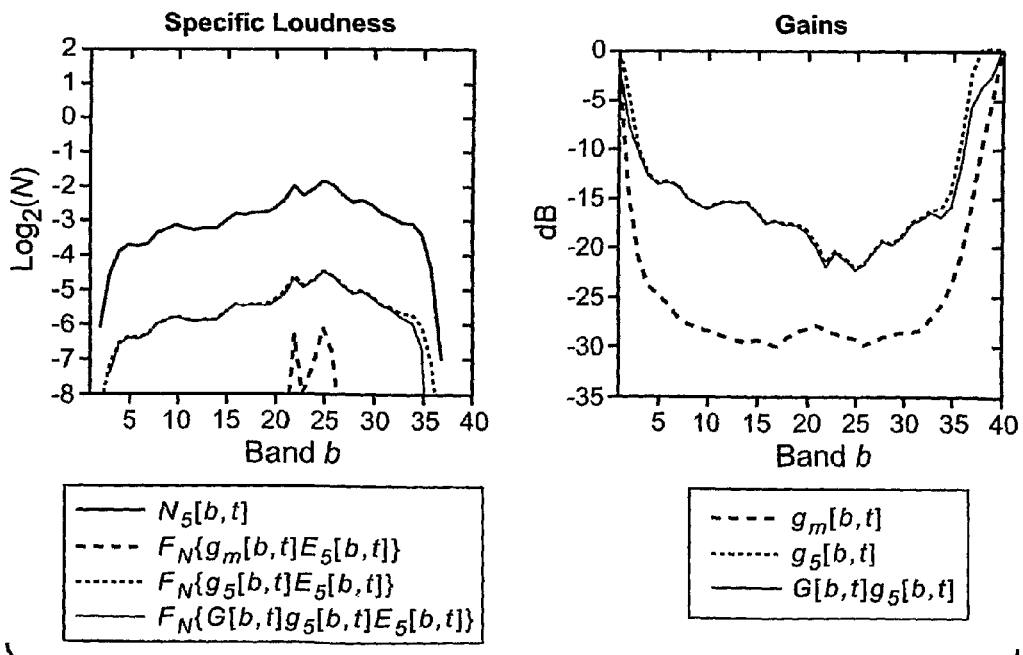
FIG. 4e (Channel 5: Right Surround)

*(Combined Channels)*

LOUDNESS MODIFICATION OF MULTICHANNEL AUDIO SIGNALS

TECHNICAL FIELD

The invention relates to audio signal processing. In particular, the invention relates to adjusting the overall perceived loudness of a multichannel audio signal while retaining approximately the relative perceived loudness between all the channels in order to preserve the perceived spatial balance. The invention includes not only methods but also corresponding computer programs and apparatus.

REFERENCES AND INCORPORATION BY REFERENCE

Certain techniques for measuring and adjusting perceived (psychoacoustic loudness) useful in better understanding aspects the present invention are described in published International patent application WO 2004/111994 A2, of Alan Jeffrey Seefeldt et al, published Dec. 23, 2004, entitled "Method, Apparatus and Computer Program for Calculating and Adjusting the Perceived Loudness of an Audio Signal" and in "A New Objective Measure of Perceived Loudness" by Alan Seefeldt et al, Audio Engineering Society Convention Paper 6236, San Francisco, Oct. 28, 2004. Said WO 2004/111994 A2 application and said paper are hereby incorporated by reference in their entirety.

Certain other techniques for measuring and adjusting perceived (psychoacoustic loudness) useful in better understanding aspects the present invention are described in published International patent application WO 2006/047600 A1 of Alan Jeffrey Seefeldt, published May 4, 2006, entitled "Calculating and Adjusting the Perceived Loudness and/or the Perceived Spectral Balance of an Audio Signal." Said WO 2006/047600 A1 application is hereby incorporated by reference in its entirety.

BACKGROUND ART

Many methods exist for objectively measuring the perceived loudness of audio signals. Examples of methods include A, B and C weighted power measures as well as psychoacoustic models of loudness such as "Acoustics—Method for calculating loudness level," ISO 532 (1975) and said PCT/US2005/038579 application. Weighted power measures operate by taking the input audio signal, applying a known filter that emphasizes more perceptibly sensitive frequencies while deemphasizing less perceptibly sensitive frequencies, and then averaging the power of the filtered signal over a predetermined length of time. Psychoacoustic methods are typically more complex and aim to better model the workings of the human ear. They divide the signal into frequency bands that mimic the frequency response and sensitivity of the ear, and then manipulate and integrate these bands while taking into account psychoacoustic phenomenon such as frequency and temporal masking, as well as the non-linear perception of loudness with varying signal intensity. The aim of all methods is to derive a numerical measurement that closely matches the subjective impression of the audio signal.

Accurate modeling of the non-linearity of the human auditory system forms the basis of perceptual models of loudness. In the 1930's, Fletcher and Munson found that the relative change in sensitivity decreased as the level of sound increased. In the 1950's, Zwicker and Stevens built on the work of Fletcher and Munson and developed more accurate and realistic models. FIG. 1, published by Zwicker, shows the growth of loudness of both a 1 kHz tone and uniform exciting noise (UEN, noise with equal power in all critical bands). For a signal level below what is often termed the "hearing threshold," no loudness is perceived. Above this threshold, there is a quick rise in perceived loudness up to an asymptote where loudness grows linearly with signal level. Where FIG. 1 shows the non-linear behavior for a 1 kHz tone, the equal loudness contours of ISO 226 in FIG. 2 show the same behavior but as a function of frequency for sinusoidal tones. The contour lines, at increments of 10 phon, show the sound pressure levels across frequency that the human ear perceives as equally loud. The lowest line represents the "hearing threshold" as a function of frequency. At lower levels the lines of equal loudness compress closer together such that relatively smaller changes in sound pressure level cause more significant changes in perceived loudness than at higher levels.

The non-linear and frequency varying behavior of the human auditory system has a direct impact on the perceived timbre and imaging of audio signals. A complex, wideband audio signal, for example music, presented at a particular sound pressure level is perceived as having a particular spectral balance or timbre. If the same audio signal is presented at a different sound pressure level and, as shown in FIG. 2, the growth of perceived loudness is different for different frequencies, the perceived spectral balance or timbre of the audio signal will be different. A complex, wideband multichannel audio signal, presented over multiple loudspeakers, is also perceived as having a particular spatial balance. Spatial balance refers to the impression of the location of sound elements in the mix as well as the overall diffuseness of the mix due to the relative level of audio signals between two or more loudspeakers. If the same multichannel audio signal is presented at a different overall sound pressure level, the non-linear growth in perceived loudness and differing growth of loudness across frequency leads to a change in the perceived spatial balance of the multichannel audio signal. This is especially apparent when there is a significant difference in level between channels. Quieter channels will be affected differently to louder channels which, for example, can lead to quiet channels dropping below the hearing threshold and audibly disappearing when the overall level is reduced.

In many situations there is a desire to adjust or scale the perceived loudness of an audio signal. The most obvious examples are the traditional volume or level controls that appear on many devices including consumer music players, home theater receiver/amplifiers and professional mixing consoles. This simple volume or level control gain adjusts the audio signal without any consideration of the human auditory system and resulting change in perceived timbre and spatial balance.

More recently Seefeldt et. al (said WO 2004/111994 A2 application) and Seefeldt (said PCT/US2005/038579 application) have disclosed inventions, aspects of which enable accurate scaling of the perceived loudness of a monophonic audio signal and, depending on whether implementations thereof are wideband or multiband, maintain the perceived timbre. According to aspects of such inventions, a desired loudness scaling or target loudness may be achieved by, in essence, inverting the loudness measurement model and calculating either a wideband gain or multiband gains that can be applied to the audio signal.

While such approaches solve the problem of adjusting the loudness of a monophonic audio signal, the question still remains of how to adjust the loudness of a multichannel audio signal.

Multichannel loudness is typically calculated as a function of the sum of the power in each channel. For weighted power methods such as the A, B and C weighted measures mentioned above, the multichannel loudness is a simple sum of the weighted power in each channel. Commonly for psychoacoustic models of loudness, a critical band power spectrum or excitation spectrum is first calculated for each channel and the excitation spectrums are then summed across all the channels to create a single excitation spectrum. Each excitation band is passed through a non-linearity, such as FIG. 1, to create a measure of loudness per band, known as specific loudness, and the specific loudness is summed across frequency to calculate a single, wideband loudness value. For both weighted power and psychoacoustics methods, the function of the sum of the power in each channel may include additional per channel weightings to take into account head related transfer function (HRTF) effects.

Because the loudness of a multichannel signal can be calculated relatively simply, it is possible to calculate a single gain that, when applied to all channels, causes an overall desired change in loudness. However, this single gain may have undesirable effects on other attributes of the multichannel presentation. If differences exist in the relative signal levels between channels in the multichannel presentation and if all channels are scaled by the same gain, quieter channels will have a larger perceived change in their loudness than louder channels. This may cause a change in the perceived spatial balance that is worst when some channels fall below the threshold of hearing. For example, in many 5.1 audio mixes for film, the front channels contain signals of a significantly higher level than the surround channels. The center channel in particular is generally used to reproduce dialogue. The lower level surround channels, however, may contain signals that create a sense of diffuseness in the mix. For example, they may contain the reverberant portion of the dialogue in order to simulate the effect of someone speaking in a large room. As the loudness of such a signal is decreased by applying the same gain to all channels, the surround channels decrease in loudness more rapidly than the front channels, eventually falling below the threshold of hearing. The result is a significant collapse in the intended diffuse spatial balance.

According to aspects of the present invention, a desired scaling in the overall perceived loudness of a multichannel presentation may be achieved to a desired accuracy, while retaining, to a desired accuracy, the relative perceived loudness among channels in order to preserve a perceived spatial balance or timbre.

DESCRIPTION OF THE DRAWINGS

FIG. 3 shows a set of critical band filter responses useful for computing an excitation signal for a psychoacoustic loudness model.

FIGS. 4a-f depict the specific loudness spectra and gains resulting from the modification of the specific loudness of a multichannel audio signal.

DISCLOSURE OF THE INVENTION

Figure 1:
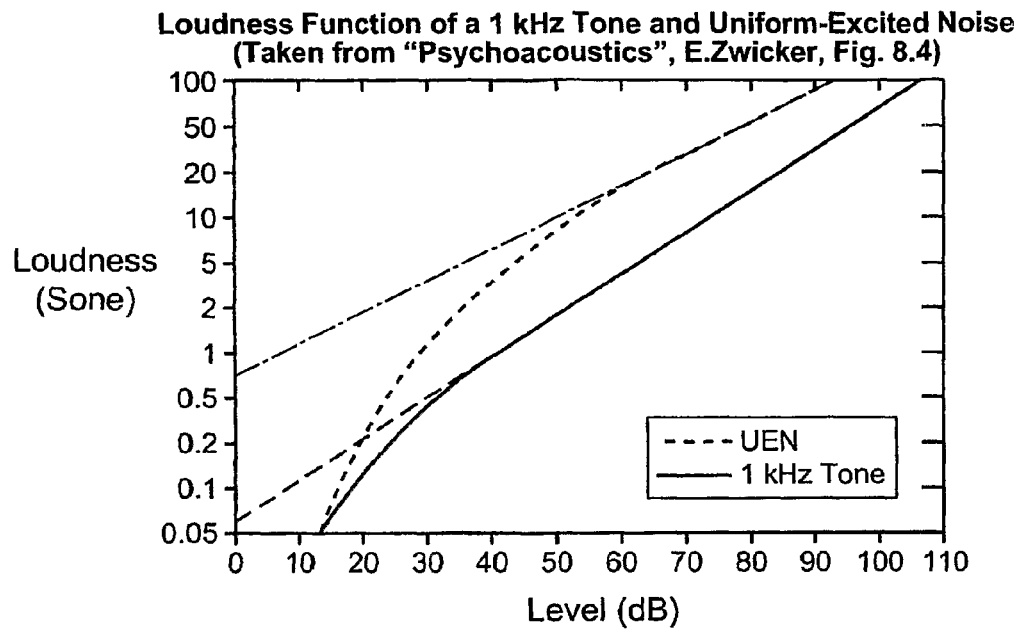
FIG. 1 shows the non-linear growth of loudness for both a 1 kHz tone and uniform exciting noise (UEN).

The invention is directed to a method for scaling, by a desired amount $s_m$, the overall perceived loudness $L_m$ of a multichannel audio signal, wherein perceived loudness is a nonlinear function of signal power P, by scaling the perceived loudness of each individual channel $L_c$ by an amount substantially equal to the desired amount of scaling of the overall perceived loudness of all channels $s_m$, subject to accuracy in calculations and the desired accuracy of the overall perceived loudness scaling $s_m$. The perceived loudness of each individual channel may be scaled by changing the gain of each individual channel, wherein gain is a scaling of a channel's power.

Optionally, in addition, the loudness scaling applied to each channel is modified so as to reduce the difference between the actual overall loudness scaling and the desired amount of overall loudness scaling.

The loudness scaling applied to each channel may be modified by applying a common multiplier to the gain of each channel or by adding a common scaling offset to the scaling of each channel.

The perceived loudness of each channel and the overall perceived loudness may both be measured in each of a plurality of frequency bands and the amplitude of each channel adjusted in such frequency bands. The frequency bands may be critical bands. Alternatively, the perceived loudness of each channel and the overall perceived loudness may both be measured in a single wideband frequency band.

In another aspect, the invention may be practiced by apparatus adapted to perform any of the above-mentioned methods.

In yet another aspect, the invention may be practiced by a computer program, stored on a computer-readable medium for causing a computer to perform any of the above-mentioned methods.

GENERAL DESCRIPTION OF INVENTION

In general terms, the measure of loudness L may be described as a function F of signal power P. Signal power P is a power measure of the audio signal. This could be the A, B or C weighted power or a multiband excitation spectrum. See, for example, ANSI S1.42-2001 (R2006), American National Standard Design Response of Weighting Networks for Acoustical Measurements. The function F is a non-linearity designed to approximate variations in the growth of loudness. This function could be as simple as the single UEN function of FIG. 1 applied to a single, wideband power measure or as complex as a psychoacoustic model of loudness where the excitation spectrum is converted, through different per-band nonlinearities, to a specific loudness spectrum and then to a single loudness value (as in said PCT/US2005/038579 application, for example). It should be noted that while traditional weighted power loudness measures such as A weighted power attempt to take into account the frequency varying sensitivity of the human auditory system, they do not take into account the variation in level sensitivity. It may therefore be useful to pass a traditional weighted power measure through a non-linearity such as the one described above.

$$L = F\{P\} \quad (1)$$

Assuming that the loudness function is invertible, a gain scaling g of the signal power P may be calculated such that the gain change results in a particular, desired scaling s of the perceived loudness.

$$s.L = F\{g.P\} \quad (2a)$$

$$g = \frac{F^{-1}\{s.L\}}{P} \quad (2b)$$

Thus, gain g is a scaling of the power P, whereas s is a scaling of the loudness L.

If the function F were linear, then Eqn. 2a would simplify to sL=gF{P}=gL that yields the trivial solution g=s, independent of the signal power P. However, with a nonlinear function F, the gain g is, in general, a function of the signal power P as shown in Eqn. 2b. In other words, different signal powers P require different gains g for the same loudness scaling s.

The overall (all channel) measure of loudness $L_m$ of a multichannel audio signal may, in practice, be approximated as a function of the sum of the per channel power $P_c$ of each of the channels in the multichannel audio signal. The total number of channels is C.

$$L_m = F\left\{\sum_{c=1}^{C} P_c\right\} \quad (3)$$

Note that the sum of the per-channel power may be weighted to take into account head related transfer function (HRTF) effects. That is, signals from different spatial directions may have slightly different, relative perceived loudness. If one knows or assumes where the listener is in relation to the loudspeakers reproducing the multiple channels, then one may build a model of the signals arriving at a listener's ears as a function of the individual channel signals (generally, filtered and summed versions of the channel signals). The loudness may then be computed from such ear signals. In practice, however, performing a power sum of the channel signals works well for most listening environments.

Now again assuming that the loudness function is invertible, a single gain $g_m$ applied to all channels may be calculated such that the result is a desired scaling $s_m$ of the overall perceived loudness.

$$s_m \cdot L_m = F\left\{g_m \sum_{c=1}^{C} P_c\right\} \quad (4a)$$

$$g_m = \frac{F^{-1}\{s_m \cdot L_m\}}{\sum_{c=1}^{C} P_c} \quad (4b)$$

However, applying the same gain scaling $g_m$ to all the channels may undesirably affect the spatial balance of the modified audio. In particular, the computation of the gain $g_m$ will be most influenced by the channels with the greatest amount of power. If other channels have significantly less power, then the gain $g_m$ may cause a significantly different perceived change in these lower level channels in comparison to the higher level channels due to the non-linearity of human loudness perception. If the scaling $s_m$ corresponds to an attenuation in loudness, too much attenuation may be applied to these lower level channels. As a result, the relative contribution of such low level channels to the spatial balance of the mix will be diminished, and at worst, the channels will become completely inaudible.

The present invention addresses the problem of maintaining the spatial balance of a multichannel audio signal while imparting a desired change to its overall loudness. Accurately measuring and characterizing the spatial balance of a multichannel audio signal is highly complex. Portions of the spectra of the various channels may fuse perceptually into virtual sources located between the speakers through which the channels are played, while other portions of the channels may combine to form the perception of a diffuse sound field surrounding the listener. Measuring the perceived loudness of these various components in relation to each other is not a well understood problem as it involves the complex phenomenon of certain audio signal components partially masking other components. The degree of masking is a function of the level of each source as well as the spatial location and diffuseness of each source. Even if one were able to accurately measure all these aspects of the spatial balance, attempting to preserve their relative measures as the overall loudness is scaled would likely involve a complex non-linear optimization process.

Consider, however, a simple example of a two-channel signal in which each channel contains a signal that does not overlap spectrally with the signal in the other channel. Each channel will then be perceived as a distinct source with neither source masking the other. In this simple case, it becomes clear that maintaining the relative loudness of the two components may be achieved by scaling the loudness of each individual channel (rather than the gain of each channel) by the same amount. The inventors have found that applying this solution generally to a multichannel signal helps preserve the spatial balance without the introduction of any objectionable side-effects.

In a basic implementation of aspects of the invention, the perceived loudness of each individual channel $L_c$ (taken in isolation) may be scaled by an amount of scaling $s_c$ substantially equal to a desired amount of scaling, $s_m$, of the overall perceived loudness of all channels, subject to accuracy in calculations and the desired accuracy of the overall perceived loudness scaling. This solution mitigates the problem, mentioned above, of low level channels falling below the threshold of hearing due to the influence of higher level channels. Such a scaling in the perceived loudness of each individual channel $L_c$ may be accomplished by controlling the individual gain $g_c$ of each channel (where such gain $g_c$ is a scaling of the channel's power $P_c$). Note, as discussed further below, that such individual channel gains $g_c$ generally are not the same as the gain $g_m$ mentioned above in connection Eqns. 4a and 4b. This may be may be better understood, for example, by reference to Eqns. 5a and 5b:

$$s_m \cdot L_c = F\{g_c \cdot P_c\} \text{ for each of } C \text{ channels} \quad (5a)$$

or $$g_c = \frac{F^{-1}\{s_m \cdot L_c\}}{P_c} \text{ for each of } C \text{ channels} \quad (5b)$$

where $s_c = s_m$.

Although such a basic implementation of the invention substantially maintains the spatial balance and is usable in many applications, such implementations may not assure that the desired overall scaling $s_m$ of the multichannel perceived loudness $L_m$ is achieved due to the non-linearity of the function F. Because F is non-linear, the gain $g_m$ given by Eqn. 4b is, in general, not equal to the gains $g_c$ given by Eqn. 5b. Therefore, the loudness of all channels after the application of $g_m$ to all channels is not equal, in general, to the loudness of all channels after applying the gains $g_c$ to each respective channel:

$$F\left\{\sum_{c=1}^{C} g_m P_c\right\} \neq F\left\{\sum_{c=1}^{C} g_c P_c\right\} \tag{6a}$$

Substituting the left hand side of Eqn. 6a with Eqn. 4a and $g_c$ with Eqn. 5b yields the equivalent expression:

$$s_m.L_m \neq F\left\{\sum_{c=1}^{C} F^{-1}\{s_m.L_c\}\right\} \tag{6b}$$

Thus, there may be a difference or error between (1) the perceived loudness of all channels resulting from scaling the perceived loudness of each of the individual channels $L_c$ by the desired overall perceived loudness scaling factor $s_m$ (expressed, for example, by the right hand portion of Eqn. 6b) and (2) the perceived loudness of all channels resulting from scaling directly by the overall loudness scaling factor $s_m$ (expressed, for example, by the left hand portion of Eqn. 6b). One may express this error as a scaling delta $\Delta s_m$ which when summed with the desired overall loudness scaling $s_m$ turns Eqn. 6b into an equality:

$$(s_m + \Delta s_m)L_m = F\left\{\sum_{c=1}^{C} F^{-1}\{s_m L_c\}\right\} \tag{6c}$$

or, rearranging, $$\Delta s_m = \frac{F\left\{\sum_{c=1}^{C} F^{-1}\{s_m L_c\}\right\}}{L_m} - s_m \tag{6d}$$

For any function F that realistically models the non-linear level behavior of human perception, such errors are generally small because the growth of loudness is close to linear over a large range. However, to minimize such errors, it may be desirable to add an optional correction to the basic implementation of the invention. Without loss of generality, one may represent such a correction as scaling deltas $\Delta s_c$ introduced to the loudness scaling of each individual channel so that that the overall loudness scaling error $\Delta s_m$ in Eqn. 6d is reduced. Generally, the scaling deltas $\Delta s_c$ are different from channel to channel. Incorporation of these channel scaling deltas $\Delta s_c$ into Eqn. 6d yields the modified expression:

$$\Delta s_m = \frac{F\left\{\sum_{c=1}^{C} F^{-1}\{(s_m + \Delta s_c)L_c\}\right\}}{L_m} - s_m \tag{6e}$$

The individual channel gains with the application of such a correction are then given by:

$$g_c^\Delta = \frac{F^{-1}\{(s_m + \Delta s_c)L_c\}}{P_c} \text{ for each of } C \text{ channels} \tag{6f}$$

One may employ any suitable technique to arrive at channel scaling deltas $\Delta s_c$, within some tolerable range, so that the absolute value of the overall loudness scaling error $\Delta s_m$ in Eqn. 6e is made smaller than that in Eqn. 6d. Thus, the absolute value of $\Delta s_m$ is made smaller. In the two implementation examples given below, it is, ideally, reduced to zero. However, the degree of the reduction in the absolute value of $\Delta s_m$ may be traded off against the size of each channel scaling delta $\Delta s_c$ so as to minimize audible channel loudness variation artifacts, in which case the ideal value of $\Delta s_m$ is not zero. The two examples of correction implementations are next described below.

An example of one way to implement such a correction is to compute first the individual channel gains $g_c$ according to a basic implementation of the invention as in Eqn. 5b and to compute next a single correction gain G for all channels that is multiplied by each channel gain $g_c$ to yield corrected channel gains, $g_c^\Delta = Gg_c$. The gain G is computed so that the overall loudness after the application of the gains $g_c^\Delta$ to each channel is equal to the original overall loudness scaled by the desired amount:

$$s_m L_m = F\left\{\sum_{c=1}^{C} g_c^\Delta P_c\right\} = F\left\{G\sum_{c=1}^{C} g_c P_c\right\} \tag{7a}$$

Solving for G yields:

$$G = \frac{F^{-1}\{s_m L_m\}}{\sum_{c=1}^{C} g_c P_c} \tag{7b}$$

This correction reduces the absolute value of the overall loudness scaling error $\Delta s_m$. Ideally, as is evident from inspection of Eqn. 7a (there is no $\Delta s_m$ factor—the scaling error is set to zero), it is reduced to zero. In practical arrangements, the scaling error may not be zero as a result of calculation accuracy, signal processing time lags, etc. Also, as mentioned above, the size of each channel scaling delta $\Delta s_c$ may be taken into account in limiting the degree of reduction of the $\Delta s_m$ error factor.

The corresponding channel scaling deltas $\Delta s_c$ are not specified directly but rather implicitly through the calculation of G. Given G, one may rearrange Eqn. 6f to solve for each channel's scaling delta $\Delta s_c$ as the ratio of the loudness of the particular channel after the application of the corrected channel gain $g_c^\Delta$ to the loudness of the original channel minus the desired overall loudness scaling:

$$\Delta s_c = \frac{F\{Gg_c P_c\}}{L_m} - s_m \tag{7c}$$

Note that it is not necessary to solve for $\Delta s_c$ (the desired correction to the overall (multichannel) loudness is effected by adjusting each channel's gain by applying the common G factor). Eqn. 7c is shown for the purpose of exposition in explaining the first correction example.

Because in practice the overall loudness scaling achieved by way of the individual channel gains is close to the desired overall loudness scaling $s_m$, the resulting correction gain G typically is close to unity and the corresponding channel scaling deltas are close to zero. As a result, the correction is not likely to cause any objectionable spatial changes.

An example of another way to apply a correction is to find a channel scaling delta $\Delta s$ common to all channels, such that $\Delta s_c = \Delta s$ for all channels, which results in reducing the absolute value of the overall loudness scaling error $\Delta s_m$. Ideally, as is evident from inspection of Eqn. 8 (there is no $\Delta s_m$ factor—the scaling error is set to zero), it is reduced to zero. In practical arrangements, the scaling error may not be zero as a result of calculation accuracy, signal processing time lags, etc. Plugging these constraints into Eqn. 6e yields the condition:

$$s_m L_m = F\left\{\sum_{c=1}^{C} F^{-1}\{(s_m + \Delta s)L_c\}\right\} \quad (8)$$

One may solve Eqn. 8 for $\Delta s$ and then compute the corresponding corrected channel gains $g_c^\Delta$ using Eqn. 6f in which $\Delta s_c = \Delta s$ for all channels. In practice, solving Eqn. 8 for $\Delta s$ requires an iterative numerical technique and is therefore less desirable than the first correction implementation described.

Aspects of the two above-described correction examples may be summarized in the following table:

Summary of Correction Examples

| Version | Gain (per channel) | Loudness Scaling (per channel) |
|---|---|---|
| Version 1 | Total gain of $Gg_c$ applied to each channel. G is the same for each channel, but $g_c$ is different for each channel. Solve for each channel's $g_c$ using Eqn. 5b and for common G using Eqn. 7b | Different scaling $s_m$ + $\Delta s_c$ for each channel. The loudness scaling delta $\Delta s_c$ is implicitly determined when solving for G |
| Version 2 | A different gain $g_c^\Delta$ is applied to each channel. Solve for each channel's $g_c^\Delta$ using Eqn. 8 and Eqn. 6f in which $\Delta s_c = \Delta s$ for all channels | Same scaling $s_m + \Delta s$ for each channel Solve for the loudness scaling delta $\Delta s$ using Eqn. 8 |

Other techniques may exist for applying approximately the same loudness scaling to each individual channel of a multi-channel signal while at the same time applying approximately a desired change to the overall loudness, and this invention is meant to cover all such techniques.

BEST MODE FOR CARRYING OUT THE INVENTION

In said WO 2004/111994 A2 application and said PCT/US2005/038579 application, Seefeldt et al and Seefeldt disclose, among other things, an objective measure of perceived loudness based on a psychoacoustic model. From a monophonic audio signal, $x[n]$, the method first computes an excitation signal $E[b,t]$ approximating the distribution of energy along the basilar membrane of the inner ear at critical band b during time block t. This excitation may be computed from the Short-time Discrete Fourier Transform (STDFT) of the audio signal as follows:

$$E[b, t] = \lambda_b E[b, t-1] + (1-\lambda_b)\sum_k |T[k]|^2 |C_b[k]|^2 |X[k, t]|^2 \quad (9)$$

where $X[k,t]$ represents the STDFT of $x[n]$ at time block t and bin k. $T[k]$ represents the frequency response of a filter simulating the transmission of audio through the outer and middle ear, and $C_b[k]$ represents the frequency response of the basilar membrane at a location corresponding to critical band b. FIG. 3 depicts a suitable set of critical band filter responses in which forty bands are spaced uniformly along the Equivalent Rectangular Bandwidth (ERB) scale, as defined by Moore and Glasberg (B. C. J. Moore, B. Glasberg, T. Baer, "A Model for the Prediction of Thresholds, Loudness, and Partial Loudness," *Journal of the Audio Engineering Society*, Vol. 45, No. 4, April 1997, pp. 224-240). Each filter shape is described by a rounded exponential function and the bands are distributed using a spacing of 1 ERB. Lastly, the smoothing time constant $\lambda_b$ in (9) may be advantageously chosen proportionate to the integration time of human loudness perception within band b.

Figure 2:
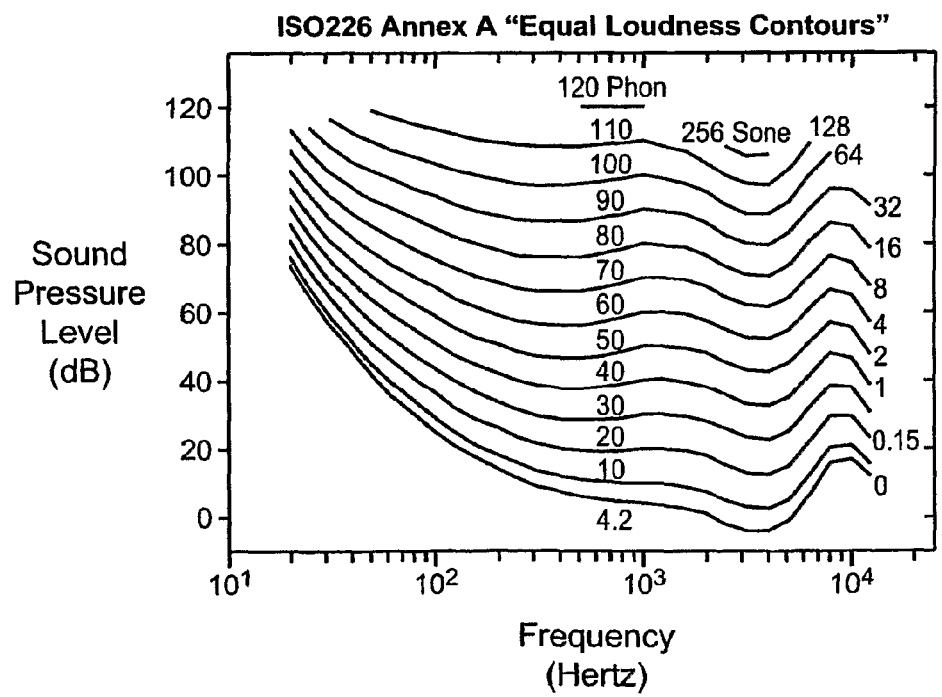
FIG. 2 shows the equal loudness contours of ISO 226. The horizontal scale is frequency in Hertz (logarithmic base 10 scale) and the vertical scale is sound pressure level in decibels.

Using equal loudness contours, such as those depicted in FIG. 2, the excitation at each band is transformed into an excitation level that would generate the same loudness at 1 kHz. Specific loudness, a measure of perceptual loudness distributed across frequency and time, is then computed from the transformed excitation, $E_{1kHz}[b,t]$, through a compressive non-linearity. One such suitable function to compute the specific loudness $N[b,t]$ is given by:

$$N[b, t] = \beta\left(\left(\frac{E_{1kHz}[b, t]}{TQ_{1kHz}}\right)^\alpha - 1\right) \quad (10)$$

where $TQ_{1kHz}$ the threshold in quiet at 1 kHz and the constants $\beta$ and $\alpha$ are chosen to match growth of loudness data as shown in FIG. 1. Finally, the total loudness, $L[t]$, represented in units of sone, is computed by summing the specific loudness across bands:

$$L[t] = \sum_b N[b, t] \quad (11)$$

For the purposes of adjusting the audio signal, one may wish to compute a wideband gain $g[t]$, which when multiplied by the audio signal makes the loudness of the adjusted audio equal to some desired target loudness, $\hat{L}[t]$, as measured by the described psychoacoustic technique. The target loudness $\hat{L}[t]$ may be computed in a variety of ways. For example, in the case of a volume control it may be computed as a fixed scaling of the original loudness $L[t]$. Alternatively, more sophisticated functions of the loudness $L[t]$ may be used, such as an Automatic Gain Control (AGC) or Dynamic Range Control (DRC). Regardless of how $\hat{L}[t]$ is computed, the corresponding gain $g[t]$ is computed in the same way. Letting the function $F_L$ represent the transformation from excitation to loudness such that $$L[t]=F_L\{E[b,t]\} \quad (12a)$$

the gain $g[t]$ is computed such that $$\hat{L}[t]=F_L\{g[t]E[b,t]\} \quad (12b)$$

Rearranging (12a-b), one arrives at the solution $$g[t] = \frac{F_L^{-1}\{s[t]L[t]\}}{E[b, t]} \text{ for any } b \quad (12c)$$

where s[t] is the loudness scaling associated with $\hat{L}[t]$ such that $$s[t] = \frac{\hat{L}[t]}{L[t]} \quad (12d)$$

and the inverse function $F_L^{-1}$ is constrained to generate an excitation that is a wideband scaling of the original excitation E[b,t]. Due to the nature of the function $F_L$ (a non-linearity applied to each band followed by a summation across bands), a closed form solution for the inverse function $F_L^{-1}$ does not exist. Instead, an iterative technique described in said WO 2004/111994 A2 application may be used to solve for the gain g[t].

Rather than compute a wideband gain g[t] to modify the audio, one may instead compute a multiband gain g[b,t] which when applied to the original audio results in a modified audio signal whose specific loudness is substantially equal to some desired target specific loudness $\hat{N}[b,t]$. By computing a multiband gain instead of a wideband gain, control of the perceived spectral balance, or timbre, of the audio may be achieved. For example, with a volume control, the target specific loudness may be computed as a band-independent scaling of the original specific loudness N[b,t], thereby preserving the original timbre of the audio as the volume is changed. In said PCT/US2005/038579 application, a variety of other techniques for computing $\hat{N}[b,t]$ as a function of N[b,t] are described, including AGC, multiband DRC, and Dynamic EQ (DEQ). Letting the function $F_N$ represent the transformation from excitation to specific loudness such that $$N[b,t] = F_N\{E[b,t]\} \quad (13a)$$

the gain g[b,t] is computed such that $$\hat{N}[b,t] = F_N\{g[b,t]\} \quad (13b)$$

Rearranging (13a-b), one arrives at the solution $$g[b, t] = \frac{F_N^{-1}\{s[b, t]N[b, t]\}}{E[b, t]} \quad (13c)$$

where s[b,t] is the specific loudness scaling associated with $\hat{N}[b,t]$ such that $$s[b, t] = \frac{\hat{N}[b, t]}{N[b, t]} \quad (13d)$$

In said PCT/US2005/038579 application, several techniques for computing $F_N^{-1}$ in (12c) are described, including a closed form expression, a lookup table, and iterative search.

Consider now a multichannel audio signal $x_c[n]$, c=1 ... C, from which an excitation $E_c[b,t]$ may be computed for each channel c. A total excitation $E_m[b,t]$ for the multichannel signal may be computed by summing all the channel excitations:

$$E_m[b, t] = \sum_{c=1}^{C} E_c[b, t] \quad (14a)$$

and a corresponding total loudness and specific loudness may be computed from the total excitation according to:

$$L_m[t] = F_L\{E_m[b,t]\} \quad (14b)$$

$$N_m[b,t] = F_N\{E_m[b,t]\} \quad (14c)$$

Likewise the loudness and specific loudness of each individual channel may be computed from each channel excitation:

$$L_c[t] = F_L\{E_c[b,t]\} \quad (15a)$$

$$N_c[b,t] = F_N\{E_c[b,t]\} \quad (15b)$$

Now suppose that one wishes to modify the multichannel audio signal so that either the total loudness $L_m[t]$ is scaled by $s_m[t]$ or the total specific loudness $N_m[b,t]$ is scaled by $s_m[b,t]$. In the first case, one may solve for a wideband gain $g_m[t]$ such that $$s_m[t]L_m[t] = F_L\{g_m[t]E_m[b,t]\} \quad (16a)$$

and in the second case solve for a multiband gain $g_m[b,t]$ such that $$s_m[b,t]N_m[b,t] = F_N\{g_m[b,t]E_m[b,t]\} \quad (16b)$$

In both cases the same gain is then applied to all channels c, but as discussed earlier, this may result is a distortion of the perceived spatial balance of the multichannel signal. In order to preserve the spatial balance, one may instead compute gains $g_c[t]$ or $g_c[b,t]$ for each channel such that each individual channel loudness or specific loudness is scaled by the desired amount:

$$s_m[t]L_c[t] = F_L\{g_c[t]E_c[b,t]\} \quad (17a)$$

$$s_m[b,t]N_c[b,t] = F_N\{g_c[b,t]E_c[b,t]\} \quad (17b)$$

This way, the relative loudness or specific loudness between all channels is preserved. However, when these gains $g_c[t]$ or $g_c[b,t]$ are applied to the corresponding channels of the original multichannel audio, the total loudness of the resulting modified multichannel audio signal may not exactly equal the total loudness of the original multichannel audio signal scaled by the desired amount. More specifically, $$s_m[t]L_m[t] \neq F_L\left\{\sum_{c=1}^{C} g_c[t]E_c[b, t]\right\} \quad (18a)$$

and $$s_m[b, t]N_m[b, t] \neq F_N\left\{\sum_{c=1}^{C} g_c[b, t]E_c[b, t]\right\} \quad (18b)$$

In many cases, the two sides of Eqns. 18a and 18b will be nearly equal and therefore for some applications the resulting error may be ignored. For the best results, however, one may compute a correction gain G[t] or G[b,t] applied to all channels such that $$s_m[t]L_m[t] = F_L\left\{G[t]\sum_{c=1}^{C}g_c[t]E_c[b,t]\right\} \quad (19a)$$

and $$s_m[b,t]N_m[b,t] = F_N\left\{G[b,t]\sum_{c=1}^{C}g_c[b,t]E_c[b,t]\right\} \quad (19b)$$

This way the desired total loudness scaling may be achieved. In most cases, the correction gain G[t] or G[b,t] is small, and therefore the spatial balance of the multichannel signal is largely preserved.

Figure 4F:
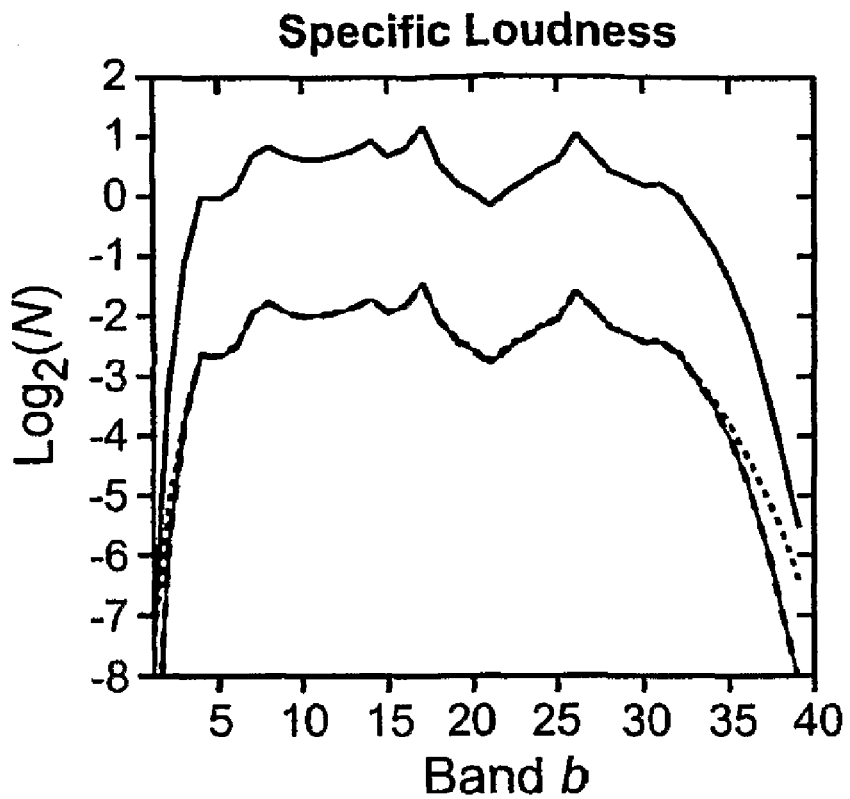

In FIGS. 4a-4f are depicted plots of the specific loudness and multiband gains for the modification of a multichannel audio signal consisting of five channels: left, center, right, left-surround, and right-surround. This particular audio signal is dominated by dialogue in the center channel, with the remaining four channels containing ambience signals of a much lower level used to convey to the impression of being in a large hall. For this particular case, the multiband gains $g_m[b,t]$ and $g_c[b,t]$ (c=1 ... 5) are computed in order to achieve a specific loudness scaling of $s_m[b,t]$=0.16 for all bands b. Examining the center channel (c=2) in FIG. 4b, one notes that the two specific loudness spectra resulting from the application of the same gain for all channels $g_m[b,t]$ and the channel-specific gain $g_2[b,t]$ are nearly identical. This is because the center channel contains the vast majority of the signal energy, and therefore computation of $g_m[b,t]$ from the combined excitation $E_m[b,t]$ is influenced mainly by this channel. Examining the remaining channels, however, one notes a large discrepancy between the two specific loudness spectra resulting from the application of $g_m[b,t]$ and $g_c[b,t]$. In these cases, because the signals are so small in comparison to the center channel, application of $g_m[b,t]$ results in a modified specific loudness that is far smaller than the desired scaling of 0.16. For many bands, the modified specific loudness falls below the threshold of hearing. This is most evident in the left and right surround channels (c=4 and 5). Application of $g_c[b,t]$, on the other hand, results in the desired specific loudness scaling. In FIG. 4f is depicted the specific loudness of all channels combined after the application of $g_m[b,t]$ to all channels and of $g_c[b,t]$ to each respective channel. One notes that, in the first case, the modified specific loudness is equal to the original combined specific loudness scaled by the desired amount, as expected. Application of $g_c[b,t]$ to each respective channel results in a modified specific loudness that is close to this result, but a small error exists at the lower and higher bands. This error is eliminated through the further application of the correction gain G[b,t], which is close to zero dB for most bands b. The average absolute value of G[b,t] across bands is 0.6 dB, and the maximum absolute value of G[b,t] is only 3.7 dB. Returning to FIGS. 4a-4e, one notes that the application of the correction gain has only a minor effect on the modified specific loudness of each individual channel.

IMPLEMENTATION

The invention may be implemented in hardware or software, or a combination of both (e.g., programmable logic arrays). Unless otherwise specified, algorithms and processes included as part of the invention are not inherently related to any particular computer or other apparatus. In particular, various general-purpose machines may be used with programs written in accordance with the teachings herein, or it may be more convenient to construct more specialized apparatus (e.g., integrated circuits) to perform the required method steps. Thus, the invention may be implemented in one or more computer programs executing on one or more programmable computer systems each comprising at least one processor, at least one data storage system (including volatile and non-volatile memory and/or storage elements), at least one input device or port, and at least one output device or port. Program code is applied to input data to perform the functions described herein and generate output information. The output information is applied to one or more output devices, in known fashion.

Each such program may be implemented in any desired computer language (including machine, assembly, or high level procedural, logical, or object oriented programming languages) to communicate with a computer system. In any case, the language may be a compiled or interpreted language.

Each such computer program is preferably stored on or downloaded to a storage media or device (e.g., solid state memory or media, or magnetic or optical media) readable by a general or special purpose programmable computer, for configuring and operating the computer when the storage media or device is read by the computer system to perform the procedures described herein. The inventive system may also be considered to be implemented as a computer-readable storage medium, configured with a computer program, where the storage medium so configured causes a computer system to operate in a specific and predefined manner to perform the functions described herein. A number of embodiments of the invention have been described. Nevertheless, it will be understood that various modifications may be made without departing from the spirit and scope of the invention. For example, some of the steps described herein may be order independent, and thus can be performed in an order different from that described.

The invention claimed is:

1. A method for scaling, by a desired amount $s_m$, the overall perceived loudness $L_m$ of a multichannel audio signal, wherein the overall perceived loudness $L_m$ is a nonlinear function of the sum of the per channel signal power $P_c$, comprising scaling the perceived loudness $L_c$ of each individual channel by an amount substantially equal to the desired amount $s_m$ of scaling of the overall perceived loudness, subject to the desired accuracy of the overall perceived loudness scaling by said amount $s_m$, wherein the perceived loudness of each individual channel is a nonlinear function of the individual channel's power $P_c$.

2. A method according to claim 1 wherein the perceived loudness of each individual channel is scaled by changing the gain $g_c$ of each individual channel, wherein gain is a scaling of a channel's power, such that the gain $g_c$ for each channel is related to the power $P_c$ of each channel according to the relationship:

$$g_c = \frac{F^{-1}\{s_m L_c\}}{P_c} = \frac{F^{-1}\{s_m F\{P_c\}\}}{P_c}$$

in which $F^{-1}$ is the inverse of the nonlinear function F relating perceived loudness L to power P:

$$L = F\{P\}.$$

3. A method according to claim 2 further comprising modifying the loudness scaling applied to each channel so as to reduce the difference between [1] the overall perceived loudness scaling resulting from the individual scaling by $s_m$, of each channel's perceived loudness and [2] the desired amount $s_m$ of overall perceived loudness scaling.

4. A method according to claim 3 wherein said difference is reduced by applying a common multiplier to the gain of each channel's power.

5. A method according to claim 3 wherein said difference is reduced by adding a common scaling offset to the scaling of each channel's loudness.

6. A method according to claim 4 or claim 5 wherein said difference may be represented as:

$$\Delta s_m = \frac{F\left\{\sum_{c=1}^{C} F^{-1}\{s_m L_c\}\right\}}{L_m} s_m,$$

where $\Delta s_m$ is the difference and C is the total number of channels.

7. A method according to claim 2 wherein the perceived loudness of each channel and the overall perceived loudness are both measured in each of a plurality of frequency bands and the gain of each channel is adjusted in such frequency bands.

8. A method according to claim 5 wherein said frequency bands are commensurate with the critical bands.

9. A method according to claim 1 wherein the perceived loudness of each channel and the overall perceived loudness are both measured in a single wideband frequency band.

10. Apparatus comprising means adapted to perform all the steps of the method of claim 1.

11. A computer program, stored on a computer-readable medium for causing a computer to perform the methods of claim 1.

* * * * *